(12) United States Patent
Tanabe

(10) Patent No.: US 6,445,414 B1
(45) Date of Patent: *Sep. 3, 2002

(54) SOLID-STATE IMAGE PICKUP DEVICE HAVING VERTICAL OVERFLOW DRAIN AND RESISTIVE GATE CHARGE TRANSFER DEVICE AND METHOD OF CONTROLLING THEREOF

(75) Inventor: Akihito Tanabe, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/989,075

(22) Filed: Dec. 11, 1997

(30) Foreign Application Priority Data

Dec. 18, 1996 (JP) .............................. 8-338432

(51) Int. Cl.[7] ........................... H04N 3/14; H01L 27/148
(52) U.S. Cl. ...................................... 348/311; 257/242
(58) Field of Search ............................... 257/242, 243, 257/244, 245; 348/314, 311

(56) References Cited

U.S. PATENT DOCUMENTS 4,168,444 A * 9/1979 van Santen .................. 257/245
5,182,623 A * 1/1993 Hynecek ..................... 257/242

FOREIGN PATENT DOCUMENTS

| JP | 56057367 A | 5/1981 |
| JP | 61164383 A | 7/1986 |
| JP | 8-205160 | 8/1996 |

OTHER PUBLICATIONS

Heyns et al., "The Resistive Gate CTD Area–Image Sensor" *IEEE Transactions on Electron Devices* 25:135–139 (1978).
T. Mochizuki, Electronic Information Telecommunications Society 1996 Report, System Society Conference Papers (issued Aug. 30, 1996), D–218, p. 220.

* cited by examiner

Primary Examiner—Wendy R. Garber
Assistant Examiner—Rashawn N Tillery
(74) Attorney, Agent, or Firm—Foley & Lardner

(57) ABSTRACT

A solid state image pickup device has a photo diodes for producing charge packets from image-carrying light, a vertical overflow drain formed under the photo diodes, charge transfer channel regions selectively connected to the photo diodes through transfer gate transistors, resistive gate electrodes capacitively coupled to said charge transfer channel regions, respectively, and a pulse signal source connected to far ends of the resistive gate electrodes and near ends of the resistive gate electrodes closer to a horizontal charge transfer unit, and the pulse signal source produces a potential gradient in the charge transfer channel regions after transfer of the charge packets to the charge transfer channel regions so that the charge packets are conveyed through the horizontal charge transfer unit without a large horizontal charge transfer signal.

12 Claims, 13 Drawing Sheets

US 6,445,414 B1

SOLID-STATE IMAGE PICKUP DEVICE HAVING VERTICAL OVERFLOW DRAIN AND RESISTIVE GATE CHARGE TRANSFER DEVICE AND METHOD OF CONTROLLING THEREOF

FIELD OF THE INVENTION

This invention relates to a solid-state image pick-up device and a method of controlling a solid-state image pick-up device and, more particularly, to a solid-state image pick-up device having resistive gate vertical charge transfer units and a method of controlling thereof.

DESCRIPTION OF THE RELATED ART

An inter-line type charge coupled device is a typical example of the solid state image pick-up device. The inter-line type charge coupled device comprises a photo-diode array, vertical shift registers and a horizontal shift register. The photo-diode array has a plurality of columns of photo-diodes, and the vertical shift registers are interposed between the columns of photo-diodes. A charge transfer region and transfer electrodes over the charge transfer region form the vertical shift register, and a charge transfer signal is supplied to the transfer electrodes so as to sequentially change the potential level under the transfer electrodes, and the vertical shift registers convey all the charge packets or every other charge packet from the associated photo-diode columns to the horizontal shift register.

The vertical shift register transfers the charge packets from the stage to stage, and is expected to accumulate all the charge packets supplied from the associated photo diode column. However, when the cell is shrunk, it becomes impossible to give sufficient capacitance to thereto.

One of the approaches to solve the problem is disclosed by Hendric Heyns et. al. in "The Resistive Gate CTD Area-Image Sensor", IEEE Transaction on Electron Devices, vol. ED-25, No. 2, pages 135 to 139, February 1978. According to the paper, a constant potential difference is applied between both ends of the resistive gate so as to create a gradient charge transfer channel along the resistive gate, and a charge packet is transferred through the gradient charge transfer channel. The charge transfer is carried out for each row of photo diodes, and each vertical charge transfer element is expected to transfer the charge packet from one photo diode. For this reason, it is possible to decrease the area assigned to the vertical charge transfer element. This results in enlargement of the area assigned to the photo-diode.

FIGS. 1 and 2 illustrate the prior art area image sensor having the resistive gate charge transfer devices or elements, and FIGS. 3 and 4 illustrates the vertical charge transfer elements and photo diodes. A photo-shield plate is removed from the layout shown in FIGS. 1 and 3 and the structure shown in FIG. 2 for better understanding. The prior art area image sensor is fabricated on a p-type semiconductor chip 1, and photo diodes 2 and n-type charge transfer regions 3 are formed in the surface portion of the p-type semiconductor chip 1. The photo diodes 2 have a MOS (Metal-Oxide-Semiconductor) structure, and the photo diodes 2 are arranged in rows and columns. The columns of photo diodes 2 and the n-type charger transfer regions 3 are alternately arranged, and each columns of photo-diodes 2 is associated with one of the n-type charge transfer regions 3. The n-type charge transfer regions 3 are hatched in FIG. 3. Heavily doped p-type channel stoppers 4 electrically isolate the photo diodes 2 from non-associated n-type charge transfer regions 3, and provide p-n junctions for generating photo charge. The channel potential is designed to be or the order of 2 volts.

The major surface of the p-type semiconductor substrate 1 is covered with an insulating layer 5, and a resistive gate electrode 6 of highly resistive polysilicon is patterned on the insulating layer 5. The resistive gate electrode 6 has gradient potential electrode portions 6a superposed over the n-channel charge transfer regions 3 and common electrode portions 6b/6c connected between the gradient potential electrode portions 6a and constant potential sources 7a/7b. The constant potential source 7a applies high potential level through the common electrode portion 6b to the gradient potential electrode portions 6a, and the other constant potential source 7b applies low potential level through the other common electrode portion 6c to the other ends of the gradient potential electrode portions 6a. As a result, gradient potential takes place along the gradient potential electrode portions 6a. The gradient potential electrode portion 6a, the insulating layer 5 and the n-type charge transfer region 3 form in combination each vertical charge transfer element.

The resistive gate electrode 6 is covered with an insulating layer 8, and accumulation electrodes 9 are patterned over the insulating layer 8. The accumulation electrodes 9 extend in perpendicular to the gradient potential electrode portions 6a, and are respectively associated with the rows of photo diodes 2. Each of the accumulation electrodes 9 is held in contact with the insulating layer 5 over the photo diodes 2 of the associated row at intervals, and image-carrying light is incident onto the depletion regions of the photo diodes 2. The incident light generates charge packets, and the charge packets are accumulated in potential wells under the accumulation electrodes 9 held in contact with the insulating layer 5.

The accumulation electrodes 9 are connected to a vertical shift register 10, and are selectively driven to a read-out potential level. When the vertical shift register 10 changes one of the accumulation electrodes 9 to the read-out potential level, charge packets are read out from the photo diodes 2 of the associated row to the n-type charge transfer regions 3, respectively, and the gradient potential in the electrode portions 6a moves the charge packets toward a horizontal charge transfer element 11.

Transfer gate electrodes 12a/12b extend over the n-type charge transfer regions 3 in the vicinity of the horizontal charge transfer element 11, and an accumulation electrode 13 extends between the transfer gate electrodes 12a/12b. The accumulation electrode 13 is covered with the insulating layer 8, and is spaced from the gradient potential electrode portion 6a, and the transfer electrodes 12a/12b are provided on both sides of the accumulation electrode 13.

The accumulation electrodes 9 and the transfer electrodes 12a/12b are covered with a transparent insulating layer 14 (see FIG. 4), and a photo shield layer 15 of aluminum is patterned on the transparent insulating layer 14. The photo shield layer 15 has openings 15a, and the photo diodes 2 are exposed to the openings 15a. The photo shield layer 15 prevents the n-type charge transfer regions 3 from the incident light.

The n-type charge transfer regions 3 are connected to anti-blooming drain regions 16, and an anti-blooming electrode 17 sweeps excess photo charge from the n-type charge transfer regions 3 to the anti-blooming drain region 16. The horizontal charge transfer element 11 is connected to an output circuit 18, and an image signal is output from the circuit 18.

The potential difference between the common electrode portions 6c and 6b produces a gradient potential along the gradient potential electrode portion 6a, and the gradient potential makes the potential well gradually high toward the transfer gate 12a. A charge packet CP is transferred from a photo diode 2 to the n-type charge transfer region 3, and is transferred along the n-type charge transfer region 3 due to the gradient potential level. The transfer gate 12a firstly makes the potential level thereunder high, and the charge packet CP is accumulated in the potential well under the accumulation electrode 13. Thereafter, the transfer gate 12b makes the potential level thereunder high, and the accumulation electrode 13 makes the potential level thereunder lower than the potential level under the transfer gate 12b. Then, the charge packet CP flows into the horizontal charge transfer element 11. The horizontal charge transfer element 11 transfers the charge packet CP to the output circuit 18, and the output circuit 18 converts the charge packet CP to corresponding output potential.

If the gradient potential electrode portion 6a is 4 millimeters and the potential difference between both ends of the channel created under the electrode 6a is 10 volts, the vertical charge transfer element transfers all the charge packets within 20 microseconds. The time period of 20 milliseconds is shorter than the horizontal sweeping time of 63.5 microseconds defined in the NTSC standards.

FIG. 6 illustrates a charge transfer operation of the prior art area image sensor. P-STE, P-AB, P-TGA, P-Select, P-STG, P-TGB and P-H represent a potential signal applied to all the accumulation electrodes 9 for changing the potential level of the accumulating wells in the photo diodes 2, an anti-blooming signal applied to the anti-blooming electrode 17, a potential signal applied to the transfer electrode 12a, a row selecting signal selectively applied to the accumulation electrodes 9, a potential signal applied to the accumulation electrode 13, a potential signal applied to the transfer electrode 12b and a charge transfer signal applied to the gate electrodes of the horizontal charge transfer element 11, respectively.

The potential signal P-TGB is changed from the low level VL-TGB to the high level VH-TGB, and is maintained at the high level VH-TGB in time period T1. The potential signal P-TGB at VH-TGB makes the potential level thereunder high, and the charge packets read out in the previous horizontal blanking period are transferred to the horizontal charge transfer element 11. The potential signal P-TGB is recovered to the low level, and the potential well under the accumulation electrode 13 is electrically isolated from the horizontal charge transfer element 11.

Image-carrying light is fallen onto the photo diode array 2, and the photo diodes 2 generate photo carrier in proportional to the intensity of pieces of image-carrying light, and the photo carrier is accumulated therein.

The anti-blooming signal P-AB is changed from the high level VH-AB to the low level VL-AB at time T2, and the n-type charge transfer regions 3 are isolated from the anti-blooming drain regions 16. The potential signal P-TGA is also changed from the low level VL-TGA to the high level VH-TGA at time T2, and the potential barrier is removed from between the n-type charge transfer regions 3 and the potential wells under the transfer gate 12a.

The row selecting signal is changed from the high level VH-Select to the low level VL-Select at time T2, and the photo carrier is read out from the selected row of photo diodes 2 to the n-type charge transfer regions 3 as charge packets. The row selecting signal P-Select is recovered to the high level VH-Select. The gradient potential transfers the charge packets along the n-type charge transfer regions 3, and the charge packets are accumulated in the potential wells under the accumulation electrode 13. The potential barrier under the transfer gate 12b does not allow the charge packets to flow into the horizontal charge transfer element 11.

The charge transfer signal P-H is repeatedly applied to the gate electrodes of the horizontal charge transfer element 11 during time period T3, and the previous charge packets are transferred to the output circuit 18.

While the previous charge packets are being transferred to the output circuit 18, the potential signal P-TGA is recovered to the high level VH-TGA at time T4, the anti-blooming signal P-AB is concurrently changed to the low level VL-AB, and the potential signal P-STE is also changed to the low level VL-STE at time T4. The potential barrier under the transfer gate 12a isolates the potential wells under the accumulation electrode 13 from the n-type charge transfer regions 3, and the n-type charge transfer regions 3 are connected to the anti-blooming drain regions 16. The potential wells in the photo diodes 2 become shallow, and excess photo carrier is swept into the n-type charge transfer regions 3. The gradient potential transfers the residual photo carrier along the n-type charge transfer regions 3, and the excess photo carrier is swept into the anti-blooming drain regions 16.

The potential signal P-STE is recovered to the high level VH-STE at time T5, and makes the potential wells in the photo diodes 2 high. Then, the image-carrying light generates photo-carrier, and the photo-carrier is accummulated in the photo diodes 2, again.

The charge packets are transferred from the potential wells under the accumulation electrode 13 to the horizontal charge transfer element 11 during the time period T6, and are transferred to the output circuit 18 during time period T7.

The prior art area image sensor encounters a problem in distortion of the output potential signal from the output circuit 18. As shown in FIG. 6, while the horizontal charge transfer element 11 is transferring the charge packets to the output circuit 11, the anti-blooming signal P-AB sweeps the residual photo carrier into the anti-blooming drain regions 16, and the potential variation of the anti-blooming signal P-AB and the potential signals P-TGA/PSTE electrically affects the output potential signal from the output circuit 18. The output potential signal is deformed, and does not represent the image fallen onto the photo diode array 2.

SUMMARY OF THE INVENTION

It is therefore an important object of the present invention to provide a solid state image pickup device which is free from the influence of the anti-blooming operation.

It is also an important object of the present invention to provide a method of controlling the solid state image pickup device.

The present inventor contemplated the problem, and noticed that a vertical overflow drain solved the problem. The vertical overflow drain directly swept excess photo carrier from photo diodes into the semiconductor substrate. However, when the vertical overflow drain was combined with the vertical charge transfer elements with the resistive gate electrode, the combination required high level driving signals. In detail, a solid state image pickup device with the vertical overflow drain required a potential signal read out from the photo-diodes to the vertical shift register higher than the row selecting signal. If large capacitance was required for the photo diodes, the read-out potential signal became much higher. The higher read-out potential signal resulted in the potential well under the accumulation electrode and the charge transfer region of the horizontal charge transfer element higher in potential level than those of the prior art, and, accordingly, the output circuit required a higher potential level in the reset drain. In order to maintain the potential level in the reset drain, it was necessary to make the amplitude of the potential signal on the accumulation electrode and the amplitude of the charge transfer signal for the horizontal charge transfer element wider than those of the prior art charge transfer device.

In this situation, the present inventor concentrated his efforts on a method of controlling a solid state image pickup device with a vertical overflow drain and resistive gate charge transfer units.

In accordance with one aspect of the present invention, there is provided a solid sate image pick-up device fabricated on a semiconductor device, comprising a plurality of photo-electric converting means for producing charge packets from an image-carrying light, a plurality of resistive gate charge transfer units having respective charge transfer channel regions and respective resistive gate electrodes capacitively coupled to the charge transfer channel regions, respectively, a plurality of first transfer gate elements having respective first transfer gate channel regions connected between the plurality of photo-electric converting means and the charge transfer channel regions and selectively changed between on-state and off-state for transferring certain charge packets to the charge transfer channel regions, respectively, a plurality of charge accumulating potential wells connectable to the charge transfer channel regions for accumulating the charge packets, a horizontal charge transfer unit electrically connectable to the plurality of charge accumulating potential wells for transferring the charge packets to an output circuit, a potential gradient producing means connected to first ends of the resistive gate electrodes and second ends of the resistive gate electrodes closer to the horizontal charge transfer unit than the first ends, and a vertical overflow drain formed under the plurality of photo-electric converting means for receiving excess charge from the plurality of photo-electric converting means.

In accordance with another aspect of the present invention, there is provided a method of controlling a solid state image pickup device including a plurality of photo-electric converting means for producing charge packets from an image-carrying light, a plurality of resistive gate charge transfer units having respective charge transfer channel regions and respective resistive gate electrodes capacitively coupled to the charge transfer channel regions, respectively, a plurality of first transfer gate elements having respective first transfer gate channel regions connected between the plurality of photo-electric converting means and the charge transfer channel regions and selectively changed between on-state and off-state for transferring certain charge packets to the charge transfer channel regions, respectively, a plurality of charge accumulating potential wells connectable to the charge transfer channel regions for accumulating the charge packets, a horizontal charge transfer unit electrically connectable to the plurality of charge accumulating potential wells for transferring the charge packets to an output circuit and a potential gradient producing means connected to first ends of the resistive gate electrodes and second ends of the resistive gate electrodes closer to the horizontal charge transfer unit than the first ends, and the method comprises the steps of a) making a potential level in the charge transfer channel region regions under the first ends higher than a potential level in the first transfer gate channel regions in the on-state so as to transfer the certain charge packets through the first transfer gate channel regions to the charge transfer channel regions, respectively, b) changing the switching elements to the off-state, and c) changing the potential level in the charge transfer channel regions under the first ends to a certain level lower than the potential level in the charge transfer channel regions under the first ends in the step a) and a potential level in the charge transfer channel regions under the second ends and higher than the potential level in the first transfer gate channel regions in the off-state so as to transfer the certain charge packets toward the plurality of charge accumulating potential wells.

In accordance with yet another aspect of the present invention, there is provided a method of controlling a solid state image pickup device including a plurality of photo-electric converting elements for producing charge packets from incident light, a plurality of resistive gate vertical charge transfer units having respective charge transfer channel regions and respective resistive gate electrodes capacitively coupled to the charge transfer channel regions, respectively, a plurality of first transfer gate elements having respective first channel regions connected between the plurality of photo-electric converting elements and the charge transfer channel regions and first transfer gate electrodes capacitively coupled to the first channel regions, respectively, for transferring certain charge packets from selected photo-electric converting elements to the charge transfer channel regions, respectively, a horizontal charge transfer unit electrically connectable to the charge transfer channel regions for transferring the charge packets to an output circuit and a controlling means connected to first ends of the resistive gate electrodes and second ends of the resistive gate electrodes closer to the horizontal charge transfer unit than the first ends, and the method comprises the steps of a) supplying a first potential level and a second potential level from the controlling means to the first ends and the second ends, respectively, so as to increase a potential difference between the selected photo-electric converting elements and the charge transfer channel regions, b) supplying a third potential level from the controlling means to the first transfer gate electrodes so that the charge packets are transferred from the selected photo-electric converting means through the first channel regions to the charge transfer channel regions, and c) supplying fourth potential from the controlling means to the first ends so as to increase a potential gradient along the charge transfer channel regions, thereby causing the plurality of resistive gate vertical charge transfer units to transfer the charge packets toward the horizontal charge transfer unit.

BRIEF DESCRIPTION OF THE DRAWINGS

The features and advantages of the solid state image pickup device and the method will be more clearly understood from the following description taken in conjunction with the accompanying drawings in which.

DESCRIPTION OF THE PREFERRED EMBODIMENTS

Figure 1:
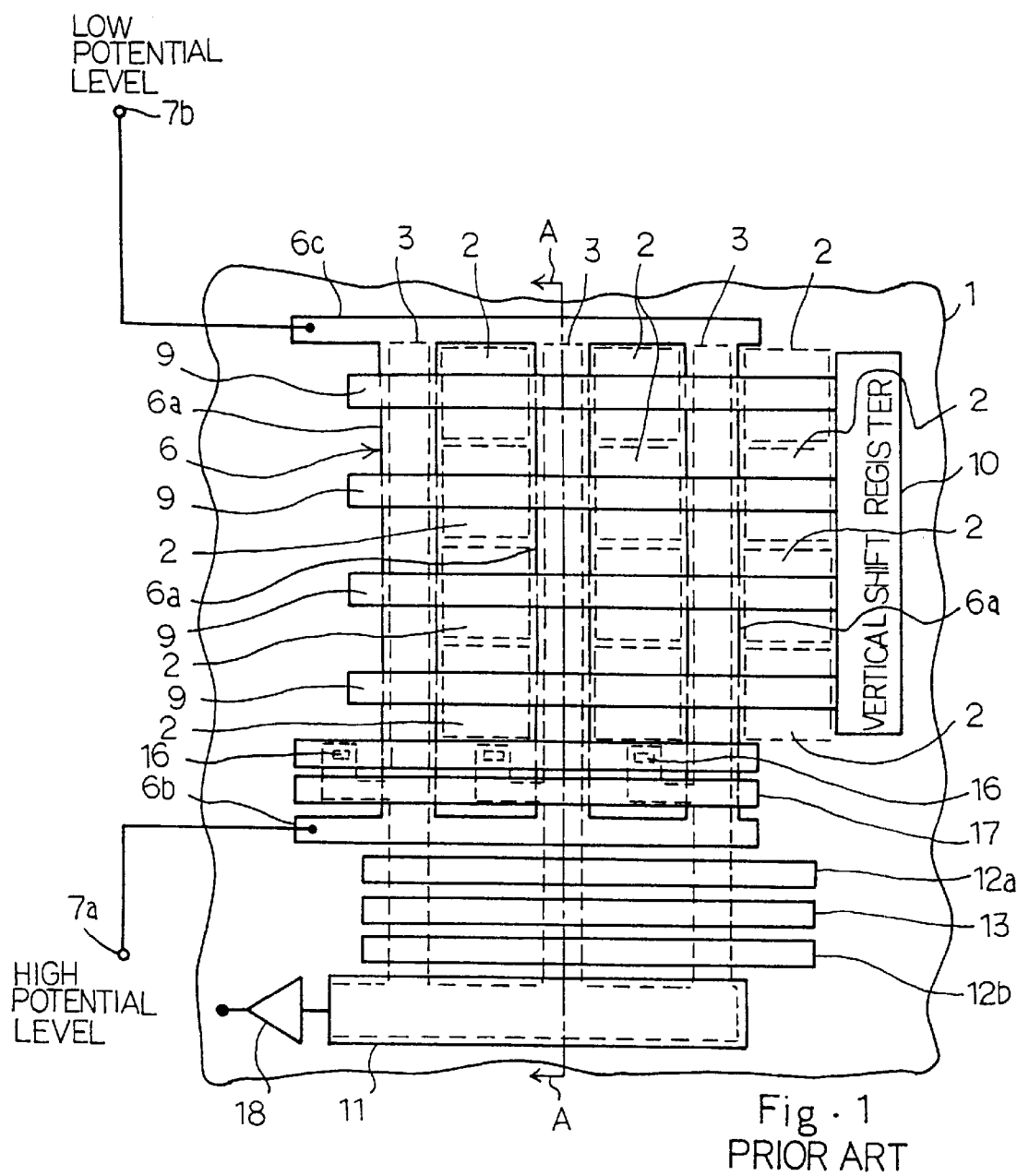
FIG. 1 is a plane view showing the layout of the prior art area image sensor.
Figure 2:
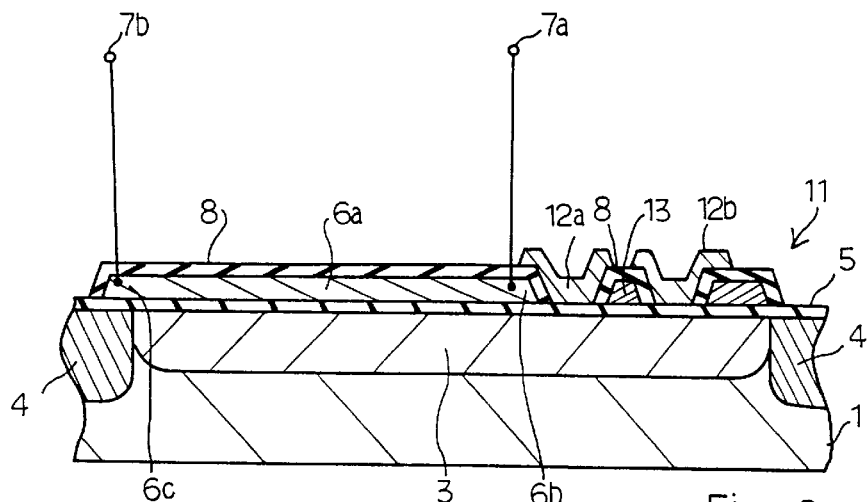
FIG. 2 is a cross sectional view taken along line A—A of FIG. 1 and showing the structure of the prior art area image sensor.
Figure 5:
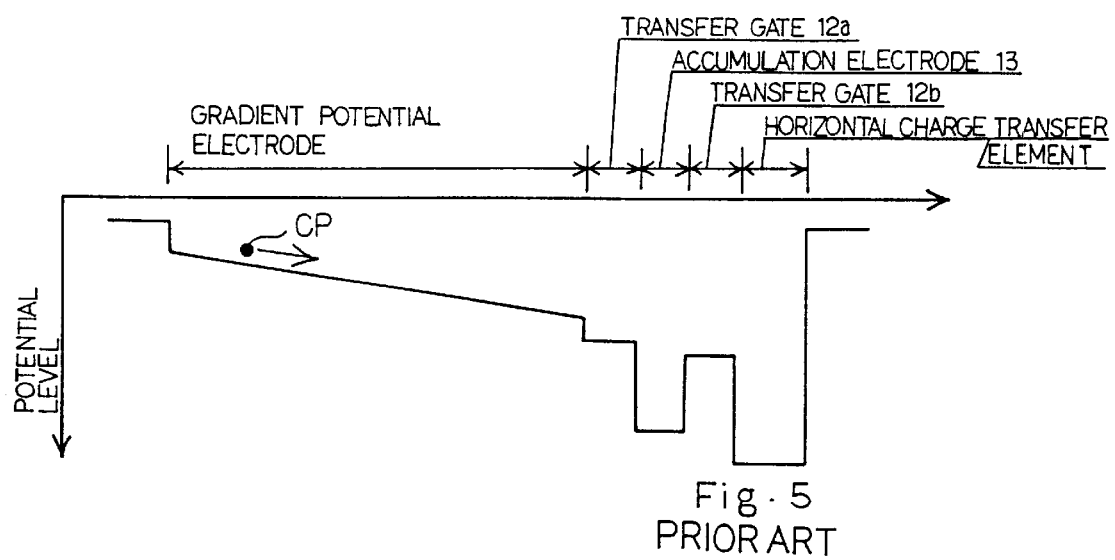
FIG. 5 is a potential diagram showing the bottom edge of the conduction band created along the vertical charge transfer element.
Figure 3:
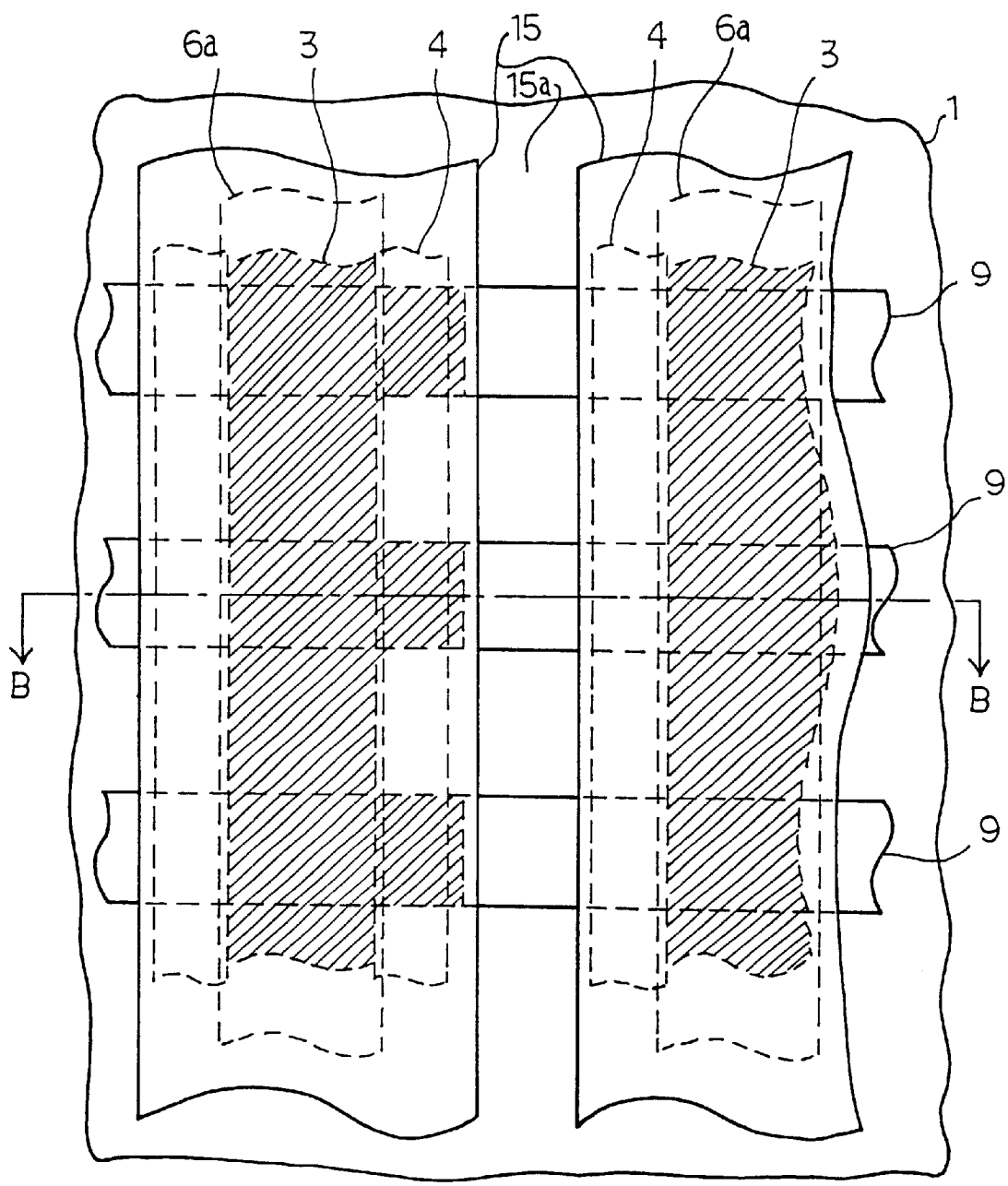
FIG. 3 is a plane view showing the layout of the photo diode and the vertical charge transfer elements incorporated in the prior art area image sensor.
Figure 4:
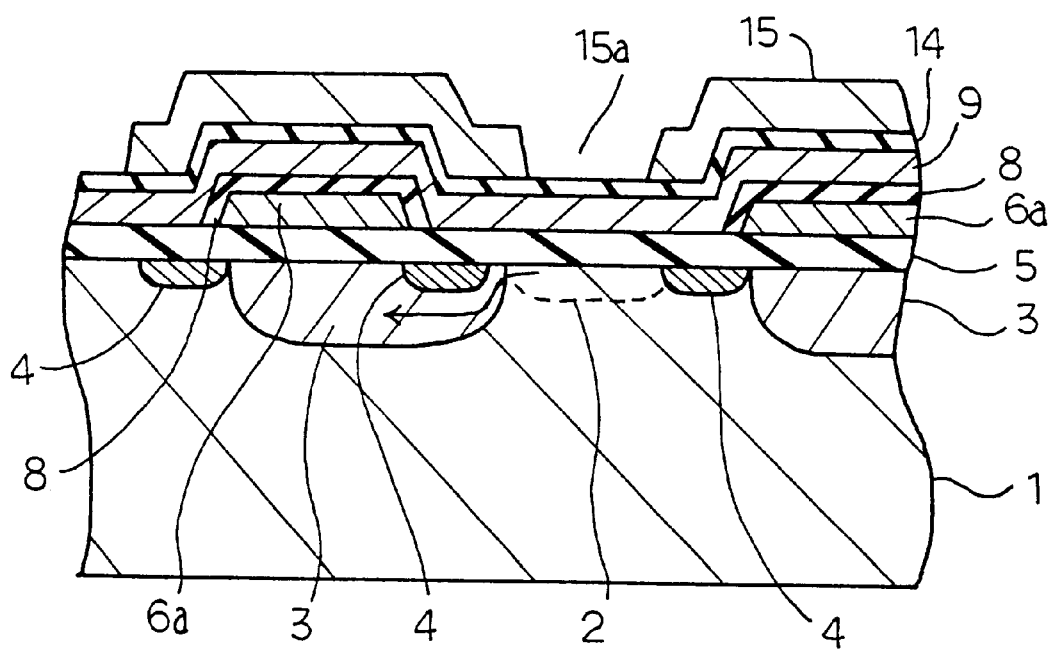
FIG. 4 is a cross sectional view taken along line B—B of FIG. 3 and showing the structure of the vertical charge transfer element and the photo diode.
Figure 6:
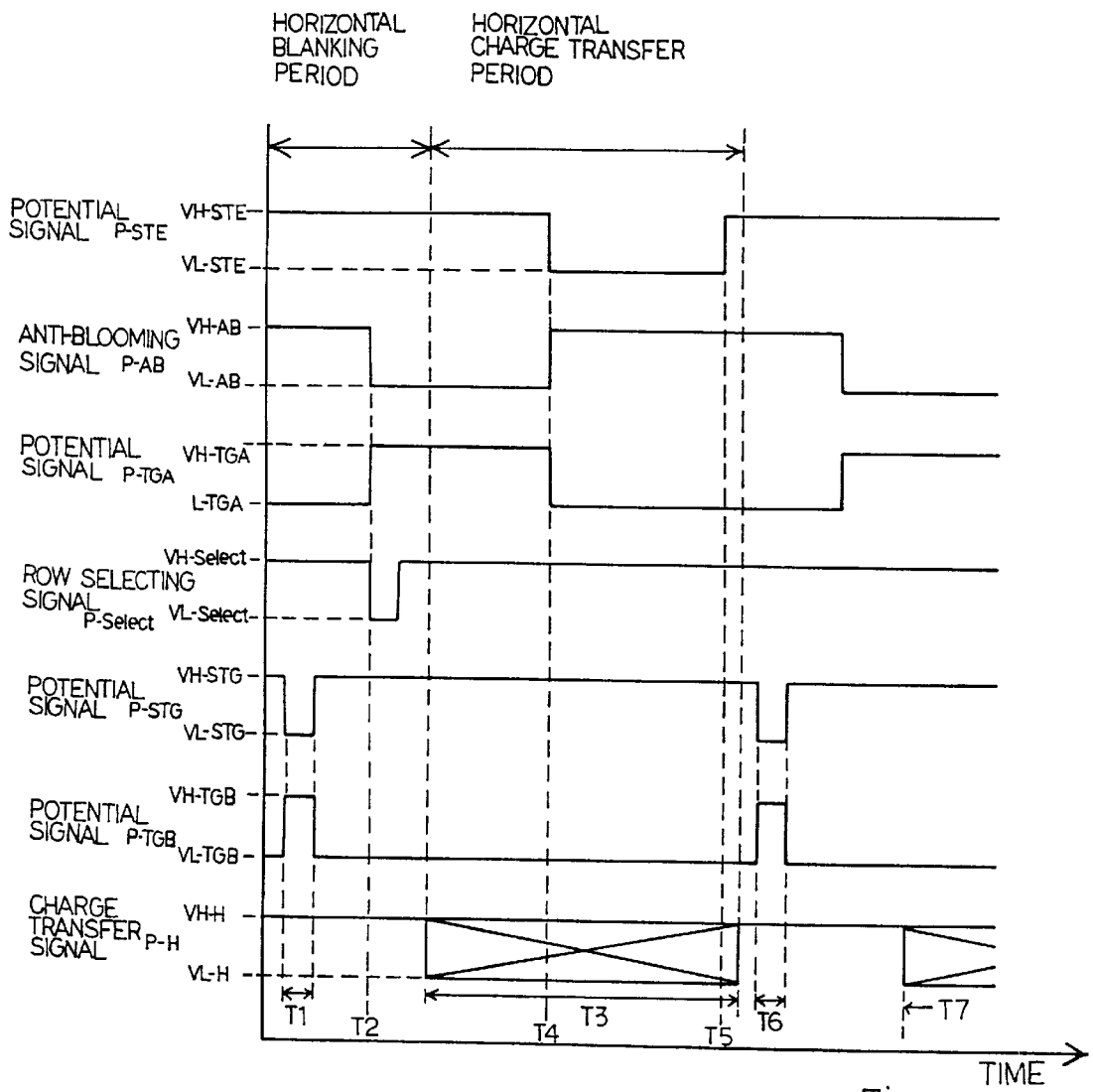
FIG. 6 is a timing chart showing the charge transfer carried out in the prior art area image sensor.
Figure 7:
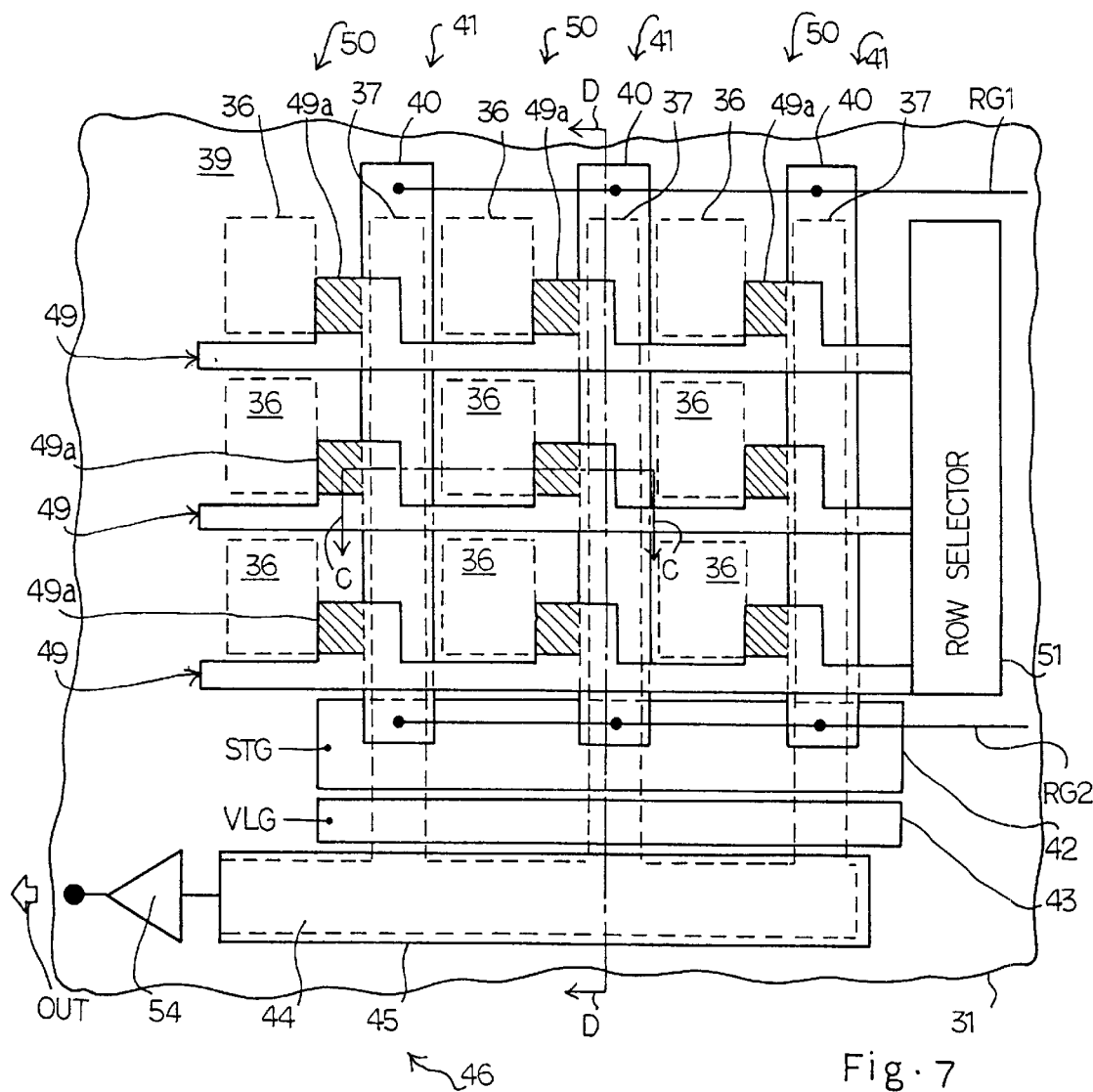
FIG. 7 is a plane view showing the layout of a solid state image pickup device according to the present invention.
Figure 8:
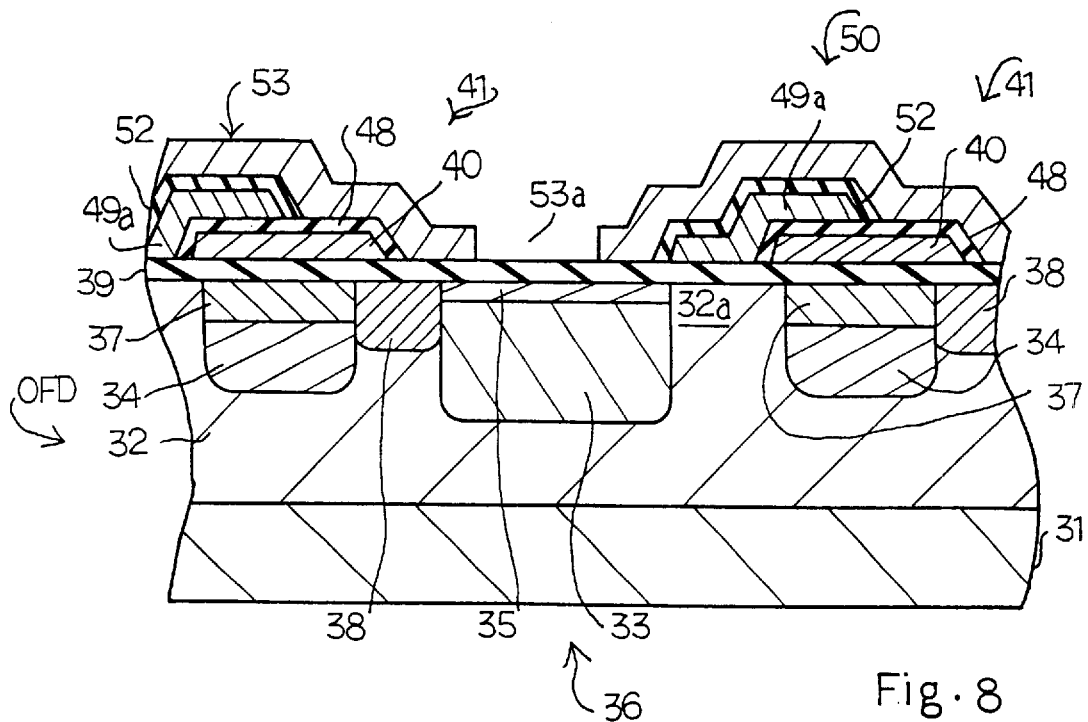
FIG. 8 is a cross sectional view taken along line C—C of FIG. 7 and showing the structure of photo diodes, a vertical overflow drain and vertical charge transfer units.
Figure 9:
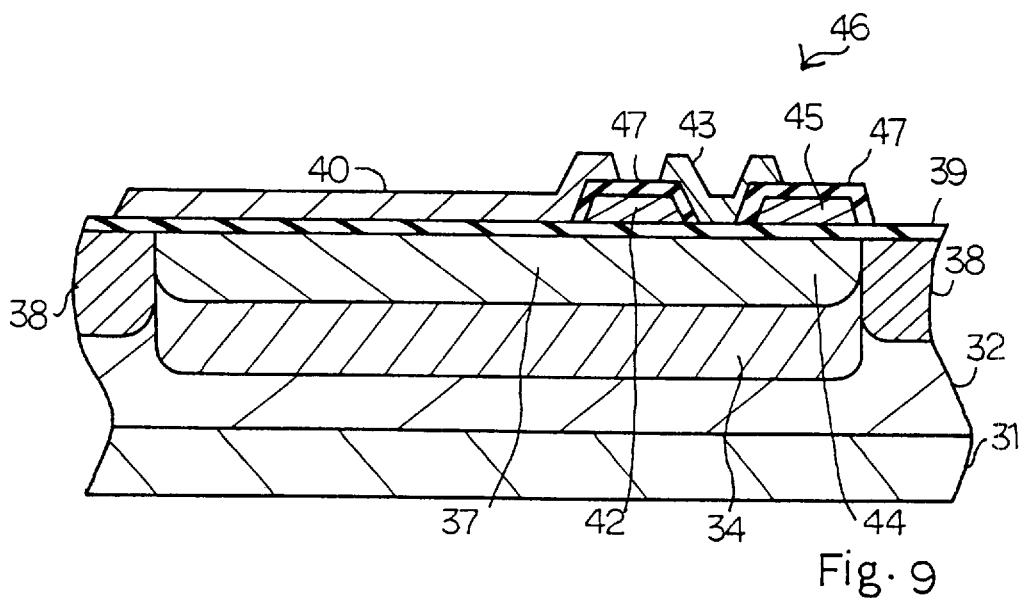
FIG. 9 is a cross sectional view taken along line D—D of FIG. 7 and showing the structure of the vertical charge transfer units.

Solid State Image Pickup Device with Vertical Overflow Drain and Resistive Gate Charge Transfer Units Referring to FIGS. 7, 8 and 9 of the drawings, a solid state image pickup device embodying the present invention is fabricated on an n-type silicon substrate 31. A photo shield layer and inter-level insulating layers are removed from the layout shown in FIG. 7 for better understanding. The photo shield layer, the inter-level insulating layers and transfer electrodes are removed from the structure shown in FIG. 9 for the same purpose.

A p-type well 32 is formed in a surface portion of the n-type silicon substrate 31, and n-type wells 33 and a p-type well 34 extends between the n-type wells 33 like a comb. Heavily-doped p-type impurity regions 35 are formed in the n-type wells 33, and the n-type wells 33 and the heavily-doped p-type impurity regions 35 form photo diodes 36. The photo diodes 36 are arranged in rows and columns, and convert image-carrying light to photo carrier. N-type charge transfer channel regions 37 are formed in surface portions of the p-type wells 34, are respectively associated with the columns of photo diodes 36. The columns of photo diodes 36 are electrically connectable through surface portions of the p-type well 32 to the associated n-type charge transfer channel regions 37, respectively, and are electrically isolated from the non-associated n-type charge transfer channel regions 37 by means of heavily-doped p-type channel stopper regions 38.

The n-type charge transfer channel regions 37, the heavily-doped p-type channel stopper regions 38, the heavily-doped p-type impurity regions 35 and the surface portions of the p-type well 32 are covered with a silicon oxide layer 39, and the silicon oxide layer 39 is transparent to the image-carrying light.

Gradient potential electrodes 40 of resistive polysilicon are patterned on the silicon oxide layer 39, and the n-type charge transfer channel regions 37 are overlapped with the gradient potential electrodes 40, respectively. Each of the gradient potential electrode, the silicon oxide layer 39 and each of the n-type charge transfer channel regions 37 formed in the p-type well 34 as a whole constitute a resistive gate vertical charge transfer unit 41, and the resistive gate vertical charge transfer units 41 are alternated with the columns of photo diodes 36.

A first pulse line RG1 is connected to one end of each gradient electrode 40, and a second pulse line RG2 is connected to the other ends of the gradient electrodes 40. Though not shown in FIG. 7, a pulse source is connected to the first pulse line RG1 and the second pulse line RG2, and produces gradient potential on the gradient electrodes 40. The larger the resistance, the smaller the electric consumption. However, if the resistance of the gradient electrodes 40 are too large, the gradient potential is not promptly produced in the gradient electrodes 40. For this reason, it is necessary to regulate the resistivity of the material used for the gradient electrodes 40. Assuming now that the gradient electrodes 40 are formed of phosphorous doped polysilicon with the resistivity of the order of 2 milliohm·cm, the gradient electrode 40 is 1 micron in width, 4 millimeters in length and 0.4 micron in thickness, and the resistance is 200 kilo-ohms. When potential difference of 10 volts is applied to the gradient electrode 40, the gradient electrode 40 allows current of 50 micron-ampere to flow through the gradient electrode 40. The silicon oxide layer 39 is assumed to be 70 nanometers thick, capacitance of 2 pF is coupled to the gradient electrode 40, and the time constant is 0.4 microsecond. As a result, the pulse rise time and the pulse decay time are 0.9 microsecond. In this way, the pulse rise time and the pulse decay time are regulable by changing the dimensions of the gradient electrode, the resistivity, the material of the gate insulating layer and the thickness of the gate insulating layer. Although the potential level of the first pulse signal PRG1 and the potential level of the second pulse signal PRG2 are varied during the vertical blanking period, it is recommendable to design the time constant to be as small as possible.

The n-type charge transfer channel regions 37 extends over the end portions of the gradient electrodes 40 connected to the second potential supply line RG2, and an accumulating electrode 42 and a final charge transfer electrode 43 extend on the silicon oxide layer 39 in the perpendicular direction to the n-type charge transfer channel regions 37.

The n-type charge transfer channel regions 37 are merged into an n-type charge transfer channel region 44 formed in the p-type well 34, and charge transfer electrodes 45 are formed on the silicon oxide layer 39 along the n-type charge transfer channel region 44. The n-type charge transfer channel region 44, the silicon oxide layer 39 and the charge transfer electrodes 45 as a whole constitute a horizontal charge transfer unit 46. The accumulating electrode 42 and the charge transfer electrodes 45 are covered with an inter-level insulating layer 47, and the inter-level insulating layer 47 electrically isolates the accumulating electrode 42 and the charge transfer electrodes 45 from the gradient electrodes 40 and the final charge transfer electrode 43. The gradient electrodes 40 and the final transfer electrode 43 are covered with an inter-level insulating layer 48.

Row selecting line 49 of polysilicon are patterned on the inter-level insulating layer 48, and inter-level insulating layer 48, and extend in the perpendicular direction to the gradient electrodes 40. Each of the row selecting lines 49 has transfer electrode portions 49a at intervals, and the transfer electrode portions 49a are located over the surface portions 32a of the p-type well 32 between the heavily-doped p-type impurity regions 35 and the n-type charge transfer channel regions 37. The surface portions 32a are indicated by hatching lines in FIG. 7, and serve as transfer transistors 50 together with the silicon oxide layer 39 and the transfer electrode portions 49a.

The row selecting lines 49 are connected to a row selector 51, and the row selector 51 selectively changes the row selecting lines 49 to an active level. When one of the row selecting line 49 is changed to the active level, the transfer transistors 50 associated therewith concurrently turn on, and electrically connect the row of photo-diodes 36 to the resistive gate vertical charge transfer units 41.

The vertical impurity profile of the photo diodes 36 is appropriately controlled so as to be completely depleted in the presence of a certain potential. A potential barrier is formed between the p-type well 32 and the n-type well 33, and the potential level of the p-type well 32 is adopted to be higher than the channel region 32a of the transfer transistor 50. In this instance, the n-type wells 33, the p-type well 32 and the n-type substrate 31 as a whole constitute a vertical overflow drain OFD.

When the photo carrier is excessively generated in the photo diodes 36, the excess photo carrier exceeds the potential barrier between the n-type wells 33 and the p-type well 32. Thus, the excess photo carrier is never accumulated in the photo diodes 36, and the potential barrier between the n-type wells 33 and the substrate 31 effectively restricts the anti-blooming phenomenon.

The row selecting lines 49 are covered with an inter-level insulating layer 52, and a photo shield layer 53 of aluminum is patterned on the inter-level insulating layer 52. The photo shield layer 53 blocks the resistive gate vertical charge transfer units 41 from the image-carrying light, and has openings 53a. The photo-diodes 36 are exposed to the openings 53a, and the image-carrying light is incident through the openings 53a onto the array of photo-diodes 36.

The horizontal charge transfer unit 46 is electrically connected to an output circuit 54, and is responsive to a horizontal charge transfer signal for transferring the charge packets to the output circuit 54. The output circuit generates an output voltage signal OUT representative of the amount of each charge packet, and is supplied through a video-signal generating circuit to a suitable display so as to reproduce the image on the screen.

In this instance, the source of first/second pulse signals RG1/RG2 and the row selector 51 as a whole constitute a controlling means.

First Embodiment

Figure 10:
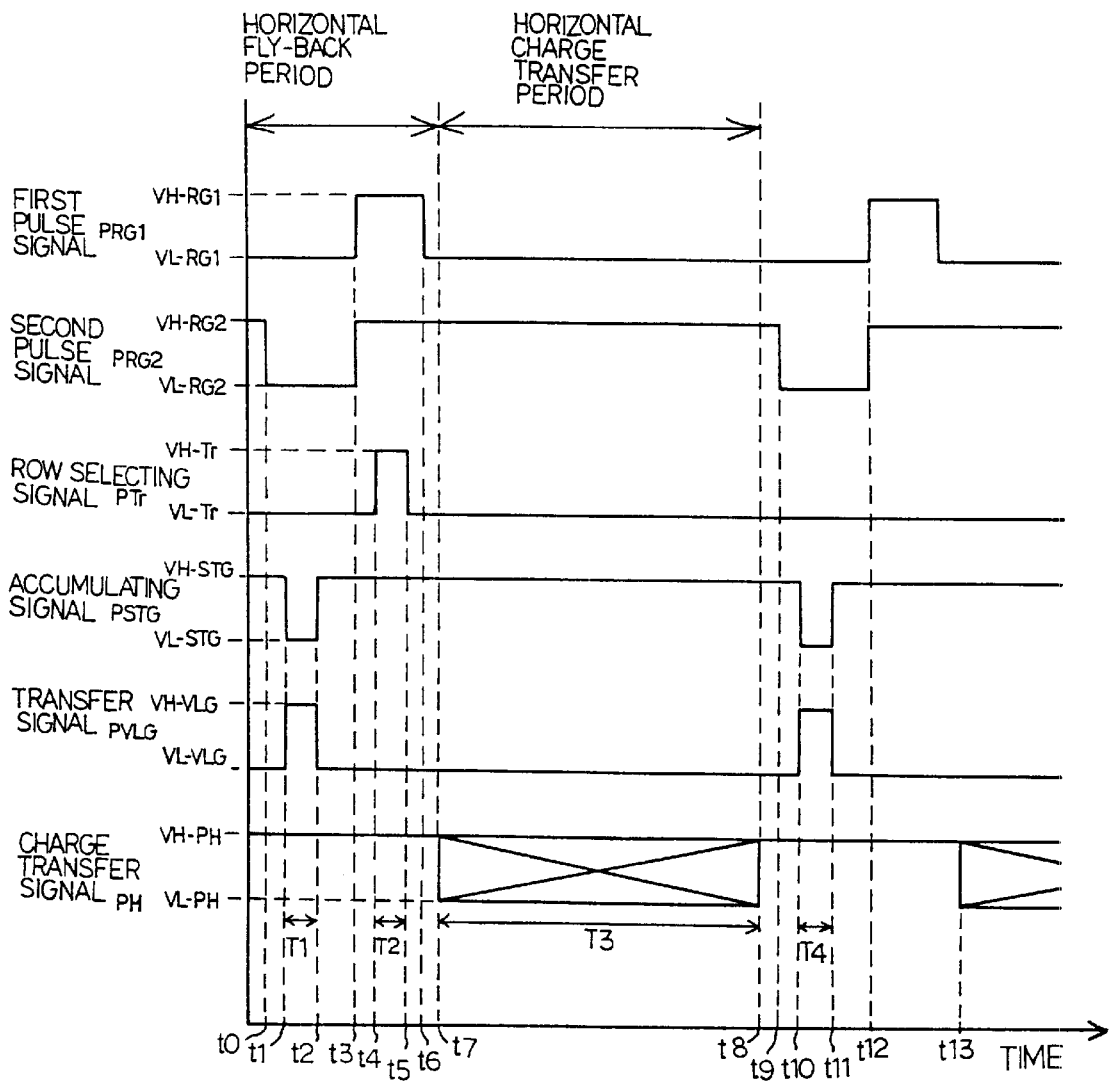
FIG. 10 is a timing chart showing a method of controlling the solid state image pickup device according to the present invention.
Figure 11:
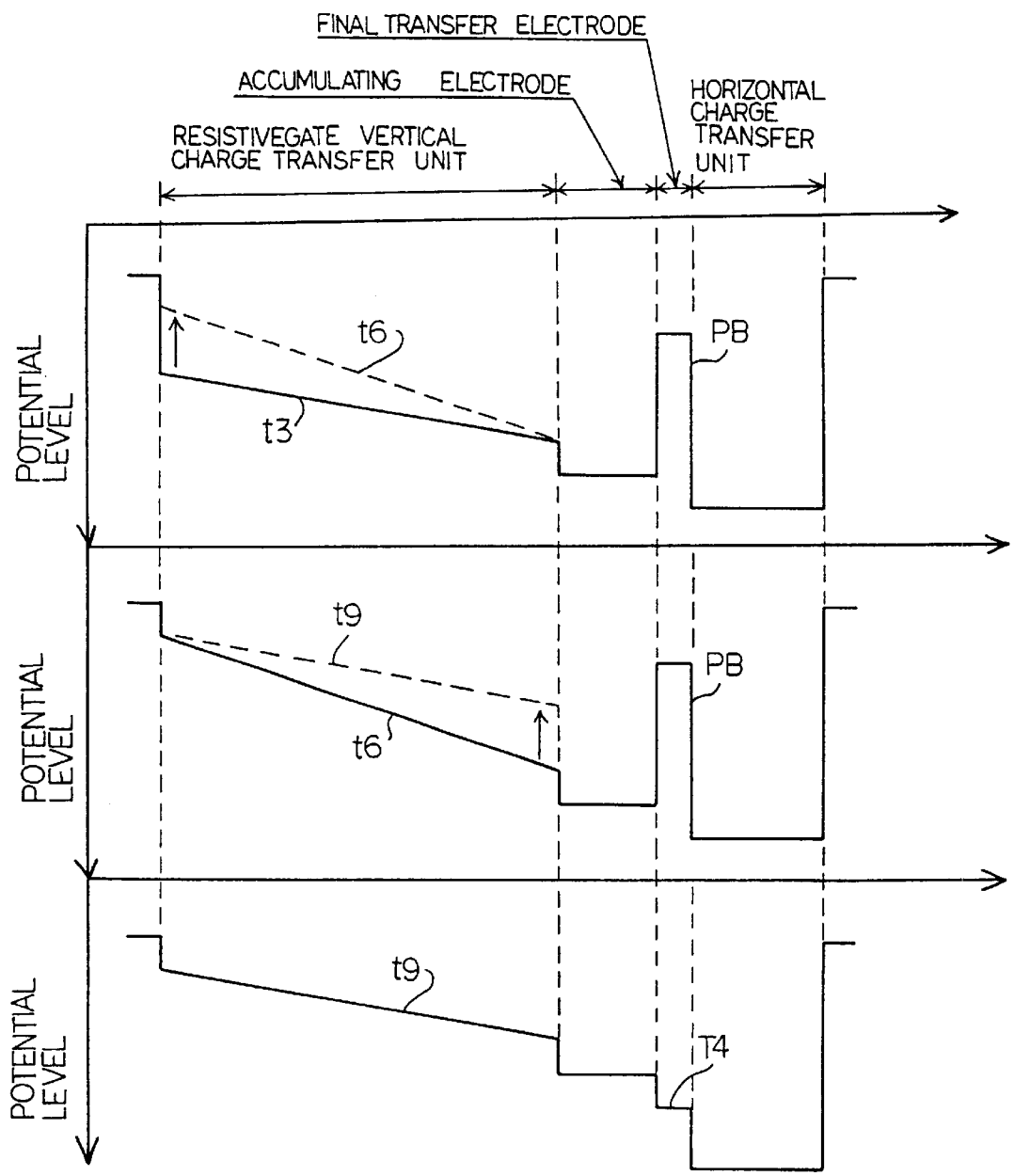
FIG. 11 is a view showing variation of potential level along a charge propagation path.

Description is hereinbelow made on a method of controlling a solid state image pickup device embodying the present invention with reference to FIG. 10. PRG1, PRG2, PTr, PSTG, PVLG and PH represent a pulse signal supplied from the first pulse line RG1, a pulse signal supplied from the second pulse line RG2, a row selecting signal supplied to one of the row selecting lines 49, an accumulating signal applied to the accumulating electrode 42, a transfer signal applied to the final transfer electrode 43 and a charge transfer signal supplied to the gate electrodes 45 of the horizontal charge transfer unit 46, respectively. These signals PRG1, PRG2, PTr, PSTG, PVLG and PH are changed between high level VH-RG1/ VH-RG2/ VH-Tr/ VH-VLG/ VH-PH and low level VL-RG1/ VL-RG2/ VL-Tr/ VL-VLG/ VL-PH. The high level VH-RG1 is lower than the low level VL-RG2, and the other high level/low level are appropriately adjusted so as to accumulate or transfer charge packets depending upon the dopant concentration under the electrodes. FIG. 11 illustrates variation of the bottom edge of the conduction band under the propagation path for the charge packets shown in FIG. 9. In the following description, the end of the n-type charge transfer channel region 37 under the connection to the first pulse supply line RG1 is hereinbelow referred to as "far end", and the other end under the connection to the second pulse supply line RG2 is referred to as "near end".

The transfer signal PVLG is changed from the low level VL-VLG to the high level VH-VLG at time t1, and the accumulating signal PSTG is complementarily changed from the high level VH-STG to the low level VL-STG. The final transfer gate 43 causes previous charge packets stored in the potential wells under the accumulating electrode 42 to flow into the n-type charge transfer channel region 44 of the horizontal charge transfer unit 46. The transfer signal PVLG is recovered to the low level VL-VLG at time t2, and the accumulating signal PSTG is changed to the high level VH-STG at the same time. Thus, the previous charge packets are transferred to the horizontal charge transfer unit 46 in time period T1.

The first pulse signal PRG1 is changed from the low level VL-RG1 to the high level VH-RG1 at time t3, and the second pulse signal PRG2 is also changed from the low level VL-RG2 to the high level VH-RG2. The channel potential level at the far ends becomes higher than the potential level in the surface portion 32a of the transfer transistor 50 under application of the high level VH-Tr. The high level VH-RG1 is lower than the high level VH-RG2, and the bottom edge declines as labeled with "t3" in FIG. 11.

Image-carrying light has been fallen onto the photo diode array 36, and the photo diodes 36 generate photo carrier depending upon the intensity of pieces of the image-carrying light. The photo carrier is accumulated in the photo diodes 36, and excess photo carrier flows over the vertical overflow drain.

The row selector 51 changes one of the row selecting lines 49 to the high level VH-Tr with the row selecting signal P-Tr at time t4, and the transfer transistors 50 associated therewith turn on so as to transfer the photo carrier to the n-type charge transfer channel regions 37. The photo carrier forms charge packets in the n-type charge transfer channel regions 37. The selected row selecting line 49 is recovered to the low level VL-Tr at time t5. Thus, the charge packets are supplied to the resistive gate vertical charge transfer units 41 during time period T2.

The first pulse signal PRGI is changed to the low level VL-RG1 at time t6, and the channel potential level at the far ends becomes lower than that at time t3 and higher than the potential level in the surface portion 32a under application of the low level VL-Tr. The bottom edge further declines as labeled with "t6". The charge packets are transferd through the n-type charge transfer channel regions 37 to the potential well under the accumulating electrode 42. As described hereinbefore, the low level VL-RG2 is higher than the high level VH-RG1, and the potential difference between the far ends and the near ends is wider than the channel potential difference corresponding to the total of the amplitude of the first pulse signal P-RG1 and the amplitude of the second pulse signal P-RG2. For this reason, the charge packets are conveyed to the potential well under the accumulating electrode 42.

The charge transfer signal is repeatedly applied to the gate electrodes 45 of the horizontal charge transfer unit 46, and the previous charge packets are transferred to the output circuit 54 during time period T3, i.e., between time t7 and time t8. The output circuit 54 produces the output voltage signal OUT from the charge packets, and supplies it to the outside of the solid state image pickup device.

The second pulse signal PRG2 is changed from the high level VH-RG2 to the low level VL-RG2 at time t9, and the potential discontinuity between the near ends and the potential well under the accumulating electrode 42 is increased.

The transfer signal PVLG is changed from the low level VL-VLG to the high level VH-VLG at time t10, and the accumulating signal PSTG is changed from the high level VH-STG to the low level VL-STG also at time t10. The final transfer gate 43 causes the charge packets stored in the potential wells under the accumulating electrode 42 to flow into the n-type charge transfer channel region 44 of the horizontal charge transfer unit 46. The transfer signal PVLG is recovered to the low level VL-VLG at time t11, and the accumulating signal PSTG is changed to the high level VH-STG also at time t11. Thus, the potential barrier PB between the potential well under the accumulating electrode 42 and the n-type charge transfer channel region 44 is removed in time period T4, and the charge packets are transferred to the horizontal charge transfer unit 46.

The first pulse signal P-RGI and the second pulse signal P-RG2 are changed as similar to those at time t3, and the charge packets are transferred to the output circuit 54 from time 13.

As will be understood from the foregoing description, the first and second pulse signals P-RG1/P-RG2 changes the channel potential level between time 0 and time t3 and between time t3 and time t6. The first pulse signal P-RG1 of the high level VH-RG1 and the second pulse signal P-RG2 of the high level make the energy level of the n-type charge transfer channel regions 37 deep, and increases the potential difference between the potential wells of the photo diodes 36 and the n-type charge transfer channel regions 37. As a result, the photo carrier smoothly flows into the n-type charge transfer channel regions 37. The first pulse signal PRG1 at the low level VL-RG1 makes the potential level in the charge transfer channel under the far ends low, and increases the potential gradient along the n-type charge transfer channel regions 37. As a result, the charge packets are conveyed to the charge transfer channel.

Furthermore, the second pulse signal PRG2 is changed to the low level VLRG2 at time t9, and the second pulse signal PRG2 at the low level VL-RG2 makes the potential level in the charge transfer region under the near ends low. This results in increase of the potential barrier height between the n-type charge transfer channel regions 37 and the potential well under the accumulating electrode 42. For this reason, the manufacturer does not need to increase the pulse height of the transfer signal PVLG and the pulse height of the accumulating signal PSTG. The controlling sequence for the first and second pulse signals PRG1/PRG2 allows the manufacturer to decrease the potential level at the reset drain of the output circuit 54 without increase of the amplitude of the charge transfer signal PH.

Second Embodiment

Figure 12:
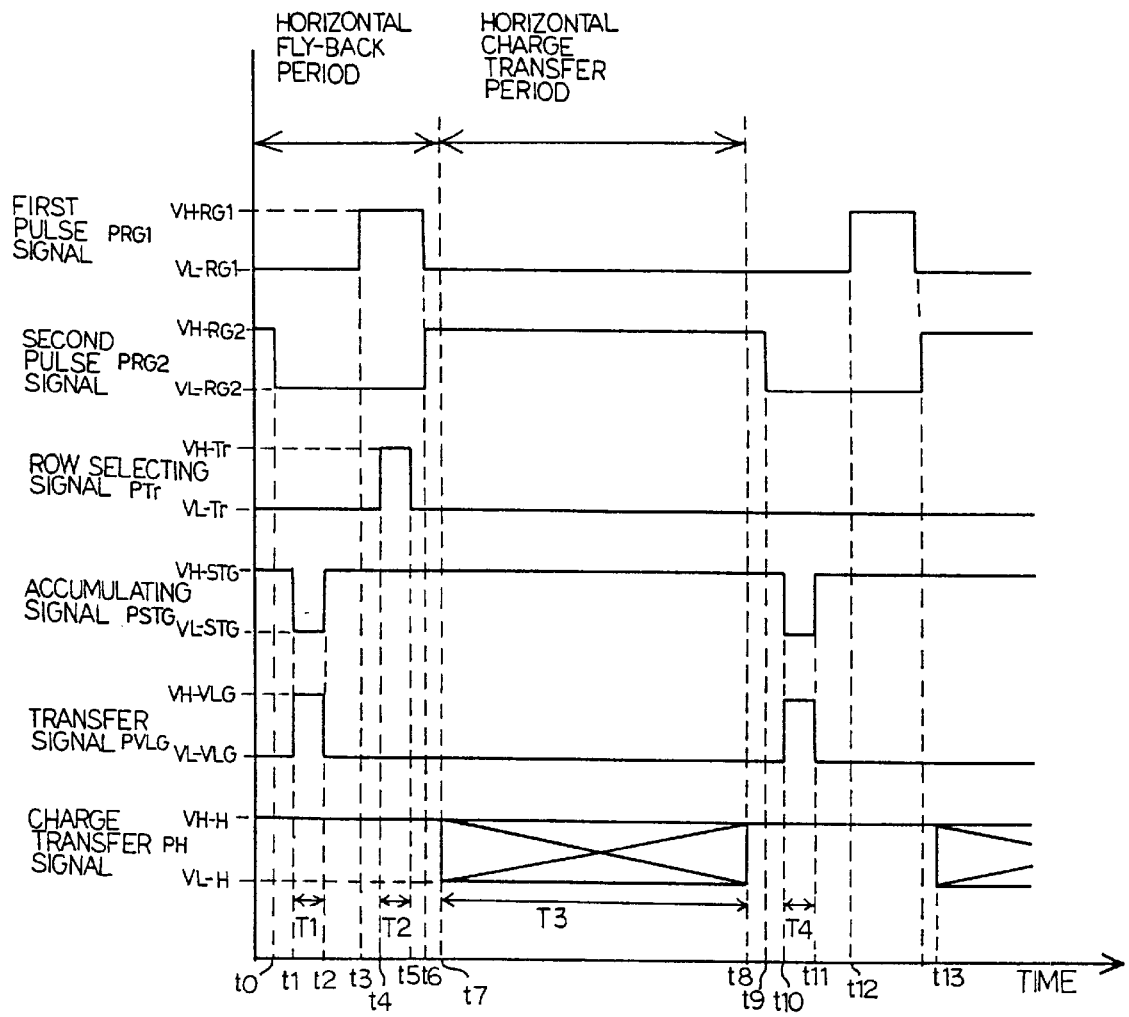
FIG. 12 a timing chart showing another method of controlling the solid state image pickup device according to the present invention.
Figure 13:
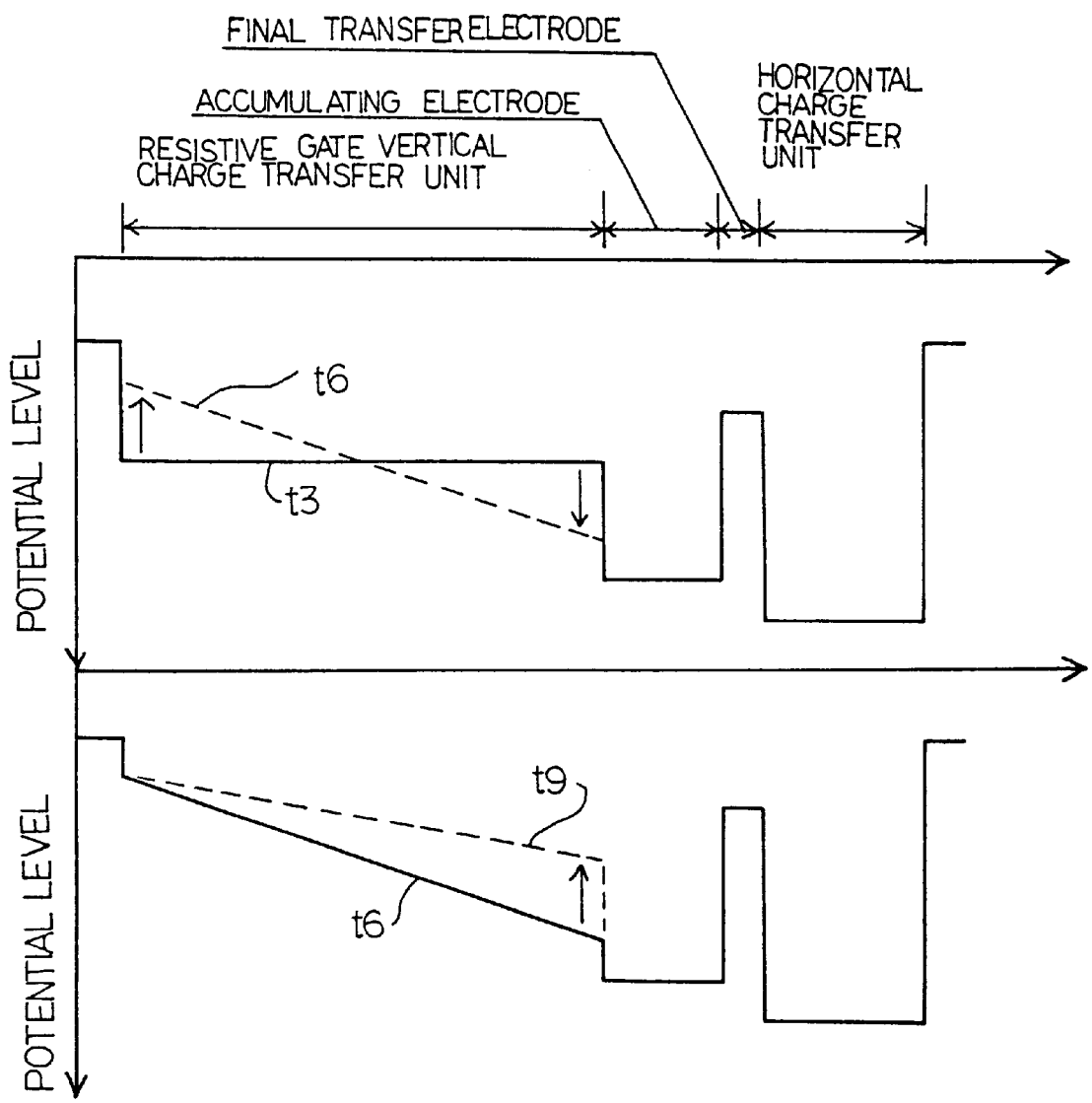
FIG. 13 is a view showing variation of potential level along a charge propagation path.

FIGS. 12 and 13 illustrate another method of controlling the solid state image pickup device shown in FIGS. 7 to 9. The method is similar to the first embodiment except for behavior of the second pulse signal PRG2. For this reason, description is focused on the second pulse signal PRG2. The second pulse signal PRG2 has the low level VL-RG2 equal to the high level VH-RG1 of the first pulse signal RG1.

In the first embodiment, the second pulse signal PRG2 is changed from the low level VL-RG2 to the high level VH-RG2 at time t3. However, the second pulse signal PRG2 of the second embodiment maintains the potential level in the low level until time t6, and changes the potential level to the high level VH-RG2 at time t6. For this reason, the bottom edge of the conduction band is horizontal at time t3, and potential gradient takes place at time t6 as shown in FIG. 13. The second pulse signal RG2 is recovered to the low level VL-RG2 at time t9 so as to increase the potential barrier height between the n-type charge transfer channel regions 37 and the potential wells under the accumulating electrode 42. The bottom edge at time t3, t6 and t9 are labeled with "t3", "t6" and "t9" in FIG. 13.

In this instance, the photo carrier is transferred from the photo diodes 36 to the n-type charge transfer channel regions 37 with the horizontal bottom edge t3. When the photo diodes 36 and the transfer transistors 50 are scaled down, the horizontal bottom edge t3 is desirable, because the transfer transistors 50 are less affected by the potential difference along the n-type charge transfer channel regions 37. In other words, the transfer transistors 50 are uniform in the charge transfer characteristics from the photo diodes 36 to the resistive gate vertical charge transfer units 41.

The method implementing the second embodiment achieves the above described advantage together with the advantages of the first embodiment.

Third Embodiment

Figure 14:
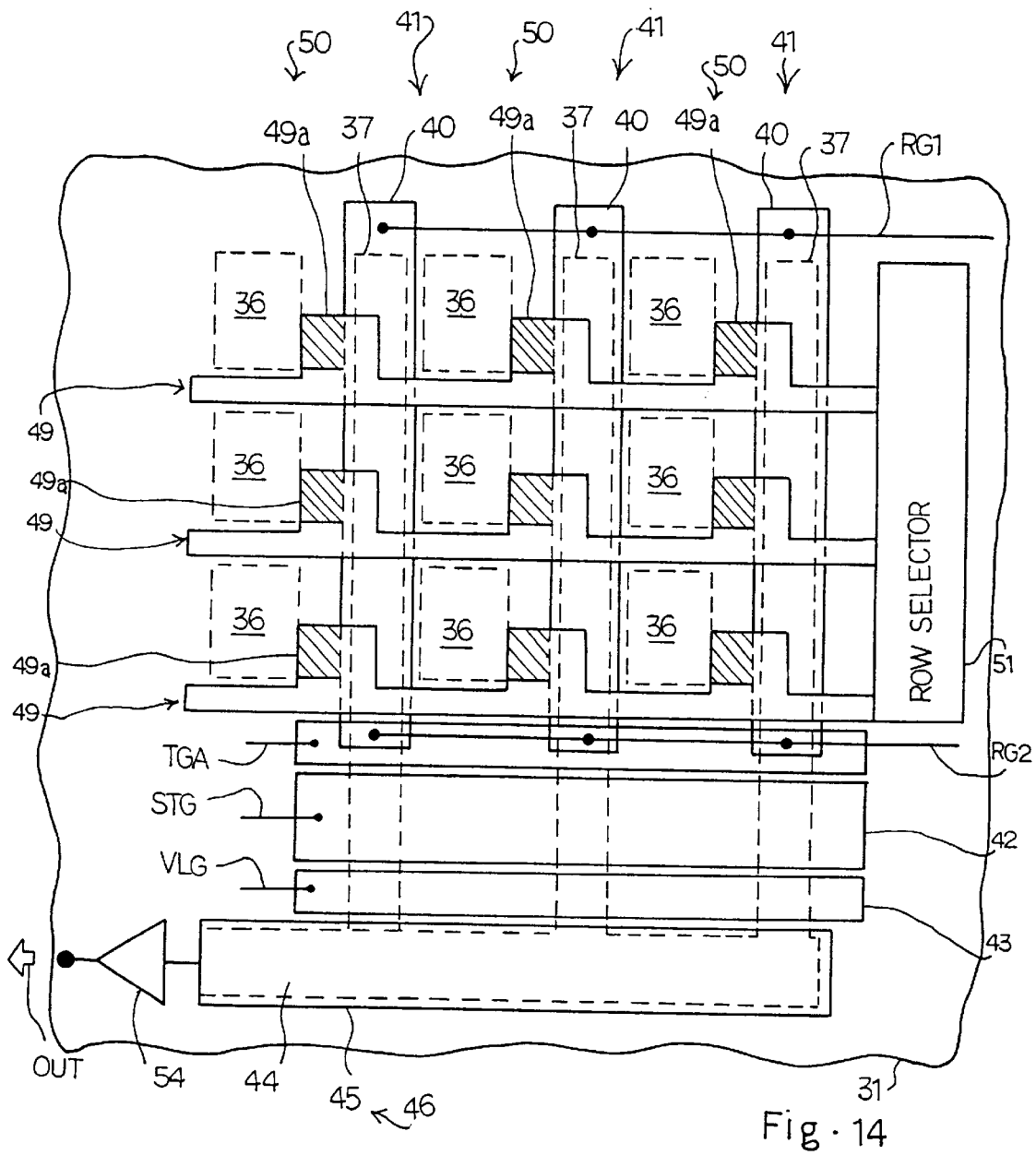
FIG. 14 is a plane view showing the layout of another solid state image pickup device according to the present invention.

A method implementing the third embodiment is used for a solid state image pickup device shown in FIG. 14. The solid state image pickup device shown in FIG. 14 is similar to the solid state image pickup device shown in FIG. 7 except for a transfer electrode 60. For this reason, the other electrodes, photo-diodes and regions are labeled with the same references designating corresponding electrodes, photo-diodes and regions of the first embodiment, and no further description is incorporated hereinbelow for the sake of simplicity.

Figure 15:
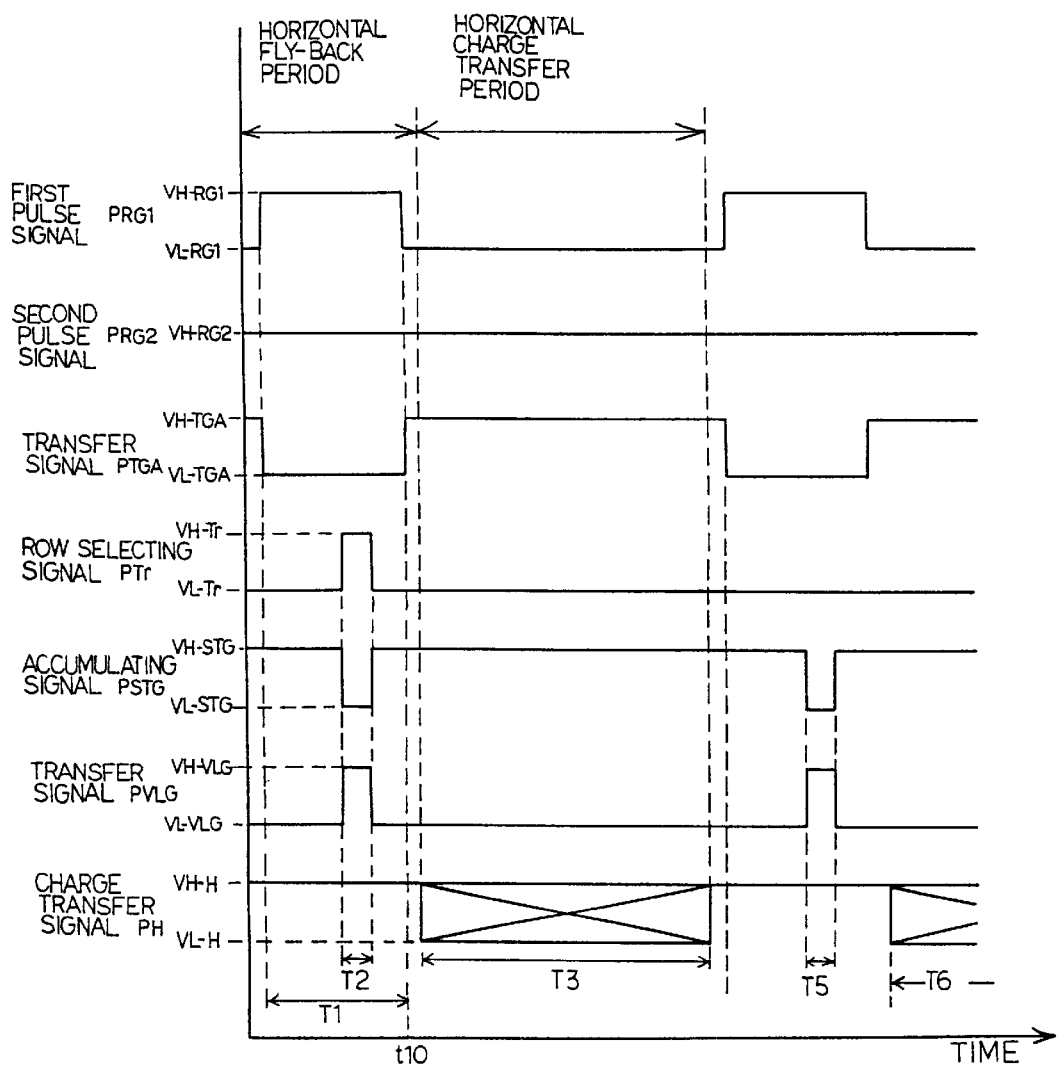
FIG. 15 is a timing chart showing a method of controlling the solid state image pickup device shown in FIG. 14.

The solid state image pickup device is controlled as shown in FIG. 15. The controlling method shown in FIG. 15 is different from the controlling method shown in FIG. 10 as follows. The second pulse signal PRG2 is maintained at the high level VH-RG2 at all times, and the high level VH-RG2 is higher than the high level VH-RG1.

The channel potential level in the n-type charge transfer channel regions 37 is changed with the first pulse signal PRG1. The first pulse signal PRG1 is maintained at the high level HV-RG1 for time period T1, and the transfer signal PTGA, which is a pulse applied to the transfer electrode 60, is maintained at the low level VL-FGA in time period T1 so as to isolate the potential well under the accumulating electrode 42 from the n-type charge transfer channel regions 37.

The row selecting signal PTr maintains one of the row selecting lines 49 at the high level VH-Tr in time period T2, and the transfer transistors 50 associated with the row selecting line 49 turn on so as to transfer the photo carrier to the n-type charge transfer channel regions 37. The gradient potential causes the resistive gate vertical charge transfer units 41 to transfer the charge packets toward the potential barrier under the transfer electrode 60 at high speed. However, the transfer signal PTGA of the low level VL-TGA does not allow the charge packets to enter into the potential wells under the accumulating electrode 42.

The accumulating signal maintains the potential level at the low level VL-STG in time period T2, and the transfer signal PVLG maintains the potential level at the high level VH-VLG in time period T2. The charge packets read out in the previous cycle are transferred to the horizontal charge transfer unit 46, and are transferred to the output circuit 54 in time period T3.

The first pulse signal PRGI changes the potential level to the low level VL-RG1 at time t10, and the transfer signal PTGA is also recovered to the high level VH-TGA. Then, the charge packets flow into the potential wells under the accumulating electrode 42.

In this way, the transfer electrode 60 isolates the n-type charge transfer channel regions 37 from the potential wells under the accumulating electrode 42, and connects the n-type charge transfer channel regions 37 to the potential wells. Using transfer signals PTGA and PVLG, the solid state image pickup device concurrently transfers the charge packets from the photo diodes to the n-type charge transfer channel regions 37 and the previous charge packets from the potential wells under the accumulating electrode 42 to the n-type charge transfer channel region 44. As a result, even if the time constant of the resistive gate vertical charge transfer units 41 is enlarged, the charge transfer is completed within the horizontal blanking period. The large time constant of the resistive gate vertical charge transfer units 41 decreases the current consumption.

In the third embodiment, the solid state image pickup device always maintains the second pulse signal PRG2 at the high level VH-RG2. However, the second pulse signal PRG2 may be changed as similar to the second pulse signal PRG2 shown in figure 10 m or 12 so as to decrease the pulse height.

The transfer gate electrodes 60/43 and the accumulating electrode 42 are connected through signal lines TGA, VLG and STG to a suitable pulse generator, and the pulse generator, the source of pulse signals RG1/RG2 and the row selector 51 as a whole constitute a controlling means.

Although particular embodiments of the present invention have been shown and described, it will be obvious to those skilled in the art that various changes and modifications may be made without departing from the spirit and scope of the present invention.

For example, the charge packets may be formed by positive electric charge. In this instance, if the relation between the potential is inverted, the foregoing description is applied to the image pickup device.

What is claimed is:

1. A method of controlling a solid state image pickup device including a plurality of photo-electric converting means for producing charge packets from an image-carrying light,
   a plurality of resistive gate charge transfer units having respective charge transfer channel regions and respective resistive gate electrodes capacitively coupled to said charge transfer channel regions, respectively,
   a plurality of first transfer gate elements having respective first transfer gate channel regions connected between said plurality of photo-electric converting means and said charge transfer channel regions and selectively changed between on-state and off-state for transferring certain charge packets to said charge transfer channel regions, respectively,
   a plurality of charge accumulating potential wells connectable to said charge transfer channel regions for accumulating said charge packets,
   a horizontal charge transfer unit electrically connectable to said plurality of charge accumulating potential wells for transferring said charge packets to an output circuit, and
   a potential gradient producing means connected to first ends of said resistive gate electrodes and second ends of said resistive gate electrodes closer to said horizontal charge transfer unit than said first ends,
   said method comprising the steps of
   a) making a potential level in said charge transfer channel regions under said first ends higher than a potential level in said first transfer gate channel regions in said on-state so as to transfer said certain charge packets through said first transfer gate channel regions to said charge transfer channel regions, respectively,
   b) changing said first transfer gate elements to said off-state, and
   c) supplying a pulse voltage to said first ends of said resistive gate electrodes so as to change said potential level in said charge transfer channel regions under said first ends to a certain level lower than said potential level in said charge transfer channel regions under said first ends in said step a), and lower than a potential level in said charge transfer channel regions under said second ends of said resistive gate electrodes, and higher than said potential level in said first transfer gate channel regions in said off-state, so as to transfer said certain charge packets toward said plurality of charge accumulating potential wells.

2. The method as set forth in claim 1, in which said potential level in said charge transfer channel under said first ends is equal to said potential level in said charge transfer channel under said second ends in said step a).

3. The method as set forth in claim 1, in which said solid state image pickup device further includes a second transfer gate element having a second transfer gate channel region connected between said plurality of charge transfer regions and said plurality of charge accumulating potential wells,
   said potential level in said charge transfer channel under said first ends is higher than a potential level in said second transfer gate channel region of said second transfer gate element in said step a),
   said second transfer gate element is changed to on-state in said step c) so as to transfer said charge packets to said plurality of charge accumulating potential wells.

4. A method of controlling a solid state image pickup device including
   a plurality of photo-electric converting elements for producing charge packets from incident light,
   a plurality of resistive gate vertical charge transfer units having respective charge transfer channel regions and respective resistive gate electrodes capacitively coupled to said charge transfer channel regions, respectively,
   a plurality of first transfer gate elements having respective first channel regions connected between said plurality of photo-electric converting elements and said charge transfer channel regions and first transfer gate electrodes capacitively coupled to said first channel regions, respectively, for transferring certain charge packets from selected photo-electric converting elements to said charge transfer channel regions, respectively,
   a horizontal charge transfer unit electrically connectable to said charge transfer channel regions for transferring said charge packets to an output circuit, and
   a controlling means connected to first ends of said resistive gate electrodes and second ends of said resistive gate electrodes closer to said horizontal charge transfer unit than said first ends,
   said method comprising the steps of:
   a) making a potential level in said charge transfer channel regions under said first ends and said second ends to a first potential level and a second potential level, respectively, that are higher than a potential level in said first transfer gate channel regions in said on-state so as to transfer said certain charge packets through said first transfer gate channel regions to said charge transfer channel regions, respectively, b) changing said switching elements to said off-state, and c) supplying a pulse voltage to said first ends of said resistive gate electrodes so as to change said potential level in said charge transfer channel regions under said first ends to a certain level lower than said potential level in said charge transfer channel regions under said first ends in said step a) and a potential level in said charge transfer channel regions under said second ends and higher than said potential level in said first transfer gate channel regions in said off-state so as to transfer said certain charge packets toward said plurality of charge accumulating potential wells.

5. The method as set forth in claim 4, in which said first potential is different from said second potential so as to produce an initial potential gradient for conveying said charge packets from said first ends to said second ends, and said potential gradient at said step c) is larger than said initial potential gradient.

6. The method as set forth in claim 4, in which said first potential is equal to said second potential so that no potential gradient takes place along said charge transfer channel regions.

7. The method as set forth in claim 4, said solid state image pickup device further includes a plurality of charge accumulating units having respective potential wells contiguous to said charge transfer channel regions, respectively, and an accumulating electrode capacitively coupled to said potential wells, and a second transfer gate element having second channel regions connected between said horizontal charge transfer unit and said potential wells, respectively, and a second transfer gate electrode capacitively coupled to said second channel regions, and said method further comprises the step of d) supplying a fifth potential level from said controlling means to said seconds end so as to increase a potential in said charge transfer channel region under said second ends.

8. The method as set forth in claim 4, in which said solid state image pickup device further includes a plurality of charge accumulating units having respective potential wells contiguous to said charge transfer channel regions, respectively, and an accumulating electrode capacitively coupled to said potential wells, a second transfer gate element having second transfer gate channel regions connected between said charge transfer channel regions and said potential wells, respectively, and a second transfer gate electrode capacitively coupled to said second transfer gate channel regions, and a third transfer gate element having third transfer gate channel regions connected between said potential wells and said horizontal charge transfer unit and a third transfer gate electrode capacitively coupled to said third transfer gate channel regions, said controlling means further supplies a fifth potential level and a sixth potential level to said accumulating electrode and said third transfer gate electrode in said step (a) so as to transfer charge packets accumulated before said step a) to said horizontal charge transfer unit, and said controlling means further supplies a seventh potential to said second transfer gate electrode in said step c) so as to allow said charge packets to flow into said potential wells.

9. The method as set forth in claim 4, in which said solid-state image pick-up device further includes a vertical overflow drain formed under said plurality of photo-electric converting elements so that excess charge flows from said photo-electric converting elements over a potential barrier produced along a boundary between said photo-electric converting elements and said vertical overflow drain.

10. The method as set forth in claim 4, in which said second potential level is constant in said steps a), b) and c).

11. A method of driving a solid state image pick-up device fabricated on a semiconductor device, the solid state image pickup device comprising:

a plurality of photoelectric converting means for producing charge packets from an image carrying light;

a plurality of resistive gate charge transfer units having respective charge transfer channel regions and respective resistive gate electrodes capacitively coupled to said charge transfer channel regions, respectively;

a plurality of first transfer gate elements having respective first transfer gate channel regions connected between said plurality of photoelectric converting means and said charge transfer channel regions and selectively changed between on state and off state for transferring certain charge packets to said charge transfer channel regions, respectively;

a plurality of charge accumulating potential wells connectable to said charge transfer channel regions for accumulating said charge packets;

a horizontal charge transfer unit electrically connectable to said plurality of charge accumulating potential wells for transferring said charge packets to an output circuit;

a potential gradient producing means connected to first ends of said resistive gate electrodes and. second ends of said resistive gate electrodes closer to said horizontal charge transfer unit than said first ends; and a vertical overflow drain formed under said plurality of photo-electric converting means for receiving excess charges from said plurality of photoelectric converting means, the method comprising:

a) creating a potential level in said charge transfer channel regions under said first ends that is higher than a potential level in said first transfer gate channel regions in said on-state, so as to transfer said certain charge packets through said first transfer gate channel regions to said charge transfer channel regions, respectively, b) changing said first transfer gate elements to said off-state, and c) supplying a pulse voltage to said first ends of said resistive gate electrodes so as to change said potential level in said charge transfer channel regions under said first ends to a certain level that is lower than said potential level in said charge transfer channel regions under said first ends in said step a), and that is lower than a potential level in said charge transfer channel regions under said second ends of said resistive gate electrodes, and that is higher than said potential level in said first transfer gate channel regions in said off-state, so as to transfer said certain charge packets toward said plurality of charge accumulating potential wells.

12. A method of driving a solid state image pick-up device fabricated on a semiconductor device, the solid state image pickup device comprising:

a plurality of photoelectric converting means for producing charge packets from an image carrying light;

a plurality of resistive gate charge transfer units having respective charge transfer channel regions and respective resistive gate electrodes capacitively coupled to said charge transfer channel regions, respectively;

a plurality of first transfer gate elements having respective first transfer gate channel regions connected between said plurality of photoelectric converting means and said charge transfer channel regions and selectively changed between on state and off state for transferring certain charge packets to said charge transfer channel regions, respectively;

a plurality of charge accumulating potential wells connectable to said charge transfer channel regions for accumulating said charge packets;

a horizontal charge transfer unit electrically connectable to said plurality of charge accumulating potential wells for transferring said charge packets to an output circuit;

a potential gradient producing means connected to first ends of said resistive gate electrodes and second ends of said resistive gate electrodes closer to said horizontal charge transfer unit than said first ends; and a vertical overflow drain formed under said plurality of photo-electric converting means for receiving excess charges from said plurality of photoelectric converting means, the method comprising:

a) creating respective first and second potential levels in said charge transfer channel regions under said first ends and said second ends, said first and second potential levels being higher than a potential level in said first transfer gate channel regions in said on-state, so as to transfer said certain charge packets through said first transfer gate channel regions to said charge transfer channel regions, b) changing said switching elements to said off-state, and c) supplying a pulse voltage to said first ends of said resistive gate electrodes so as to change said potential level in said charge transfer channel regions under said first ends to a certain level that is lower than said potential level in said charge transfer channel regions under said first ends in said step a) and that is lower than a potential level in said charge transfer channel regions under said second ends, and that is higher than said potential level in said first transfer gate channel regions in said off-state, so as to transfer said certain charge packets toward said plurality of charge accumulating potential wells.

* * * * *